(12) United States Patent
Tabata et al.

(10) Patent No.: US 11,466,366 B2
(45) Date of Patent: *Oct. 11, 2022

(54) ELECTRIC DISCHARGE GENERATOR AND POWER SUPPLY DEVICE OF ELECTRIC DISCHARGE GENERATOR

(71) Applicant: Toshiba Mitsubishi—Electric Industrial Systems Corporation, Chuo-ku (JP)

(72) Inventors: Yoichiro Tabata, Tokyo (JP); Kensuke Watanabe, Tokyo (JP); Shinichi Nishimura, Tokyo (JP)

(73) Assignee: TOSHIBA MITSUBISHI—ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 94 days.

This patent is subject to a terminal disclaimer.

(21) Appl. No.: 15/521,645

(22) PCT Filed: Oct. 29, 2014

(86) PCT No.: PCT/JP2014/078723
§ 371 (c)(1),
(2) Date: Apr. 25, 2017

(87) PCT Pub. No.: WO2016/067380
PCT Pub. Date: May 6, 2016

(65) Prior Publication Data
US 2017/0241021 A1    Aug. 24, 2017

(51) Int. Cl.
*C23C 16/00*        (2006.01)
*C23C 16/503*       (2006.01)
(Continued)

(52) U.S. Cl.
CPC .......... *C23C 16/503* (2013.01); *C23C 16/34* (2013.01); *C23C 16/4588* (2013.01);
(Continued)

(58) Field of Classification Search
None
See application file for complete search history.

(56) References Cited

U.S. PATENT DOCUMENTS 5,932,116 A     8/1999   Matsumoto et al.
6,082,294 A *   7/2000   Simpson .............. C23C 16/272
                                                  118/723 E
(Continued)

FOREIGN PATENT DOCUMENTS

CN    101765902 A    6/2010
EP    0 831 679 A1   3/1998
(Continued)

OTHER PUBLICATIONS

Office Action dated Apr. 27, 2018 in Korean Patent Application No. 10-2017-7010742 with unedited computer generated English translation, citing documents AA and AO therein, 10 pages.
(Continued)

*Primary Examiner* — Sylvia MacArthur
*Assistant Examiner* — Michelle Crowell
(74) *Attorney, Agent, or Firm* — Xsensus LLP

(57) ABSTRACT

An electric discharge generator and power supply device of electric discharge generator includes a radical gas generation apparatus, a process chamber apparatus, and an n-phase inverter power supply device. The radical gas generation apparatus is located adjacent to the process chamber apparatus. The radical gas generation apparatus includes a plurality of (n) discharge cells. The n-phase inverter power supply device includes a power supply circuit configuration offering a means to control output of n-phase alternating
(Continued)

current voltages and variably controls, according to positions of the plurality of discharge cells, the alternating current voltages of different phases.

8 Claims, 3 Drawing Sheets

(51) Int. Cl.
  *H05H 1/46* (2006.01)
  *C23C 16/50* (2006.01)
  *H01L 21/31* (2006.01)
  *H01J 37/32* (2006.01)
  *C23C 16/34* (2006.01)
  *C23C 16/458* (2006.01)
  *C23C 16/52* (2006.01)

(52) U.S. Cl.
  CPC .............. *C23C 16/50* (2013.01); *C23C 16/52* (2013.01); *H01J 37/32036* (2013.01); *H01J 37/32045* (2013.01); *H01J 37/32348* (2013.01); *H01J 37/32357* (2013.01); *H01L 21/31* (2013.01); *H05H 1/46* (2013.01); *H01J 2237/3321* (2013.01)

(56) References Cited

U.S. PATENT DOCUMENTS

| | | | |
|---|---|---|---|
| 6,489,585 | B1 | 12/2002 | Nakamura et al. |
| 6,764,658 | B2 * | 7/2004 | Denes .................... B29C 59/14 |
| | | | 118/723 E |
| 7,453,191 | B1 * | 11/2008 | Song ................ H01J 37/32357 |
| | | | 313/231.31 |
| 7,543,546 | B2 * | 6/2009 | Shibata ............ H01J 37/32009 |
| | | | 118/723 E |
| 8,857,371 | B2 | 10/2014 | Tabata et al. |
| 2003/0104141 | A1 * | 6/2003 | Amato-Wierda ... C23C 16/4407 |
| | | | 427/580 |
| 2006/0251550 | A1 * | 11/2006 | Keras .................... B01D 53/32 |
| | | | 422/186.04 |
| 2007/0281106 | A1 | 12/2007 | Lubomirsky et al. |
| 2009/0152097 | A1 | 6/2009 | Eichler et al. |
| 2010/0006543 | A1 * | 1/2010 | Sawada ............ H01J 37/32091 |
| | | | 216/67 |
| 2010/0081293 | A1 | 4/2010 | Mallick et al. |
| 2010/0193129 | A1 | 8/2010 | Tabata et al. |
| 2011/0048326 | A1 | 3/2011 | Kato et al. |
| 2012/0073501 | A1 | 3/2012 | Lubomirsky et al. |
| 2012/0219460 | A1 * | 8/2012 | Okihara .................. C01B 13/11 |
| | | | 422/111 |
| 2012/0251395 | A1 * | 10/2012 | Nakamura .............. C01B 13/11 |
| | | | 422/110 |
| 2013/0098753 | A1 * | 4/2013 | Sanematsu ............... B08B 7/00 |
| | | | 204/164 |
| 2013/0126513 | A1 * | 5/2013 | Marakhtanov ........... H05B 7/18 |
| | | | 219/383 |
| 2013/0157469 | A1 * | 6/2013 | Koshiishi .......... C23C 16/45565 |
| | | | 438/712 |
| 2014/0017133 | A1 * | 1/2014 | Nishimura .............. C01B 13/11 |
| | | | 422/110 |
| 2014/0030152 | A1 * | 1/2014 | Nishimura .............. C01B 13/11 |
| | | | 422/111 |
| 2014/0083362 | A1 | 3/2014 | Lubomirsky et al. |
| 2014/0123897 | A1 | 5/2014 | Tabata et al. |
| 2014/0139049 | A1 * | 5/2014 | Fischer .................... B44C 1/227 |
| | | | 307/149 |
| 2014/0186990 | A1 * | 7/2014 | Kusuhara ............. H05H 1/2406 |
| | | | 438/72 |
| 2014/0219883 | A1 * | 8/2014 | Tabata ..................... B01J 35/02 |
| | | | 422/186.14 |
| 2014/0255256 | A1 * | 9/2014 | Nakamura .............. C01B 13/11 |
| | | | 422/111 |
| 2015/0184293 | A1 | 7/2015 | Kato et al. |
| 2017/0226637 | A1 | 8/2017 | Lubomirsky et al. |
| 2018/0223433 | A1 * | 8/2018 | Watanabe ............... C23C 16/50 |

FOREIGN PATENT DOCUMENTS

| | | | | |
|---|---|---|---|---|
| JP | 60232570 | A | * 11/1985 | ........ G03G 15/0291 |
| JP | 2001-135628 | A | 5/2001 | |
| JP | 2004-111739 | A | 4/2004 | |
| JP | 2005-123159 | A | 5/2005 | |
| JP | 2006-313674 | A | 11/2006 | |
| JP | 2007-266489 | A | 10/2007 | |
| JP | 2008-206372 | A | 9/2008 | |
| JP | 2011-154973 | A | 8/2011 | |
| JP | 2016085935 | A | * 5/2016 | |
| KR | 10-2012-0030721 | A | 3/2012 | |
| TW | 201322330 | A1 | 6/2013 | |
| WO | 2007/140425 | A2 | 12/2007 | |
| WO | 2009/028084 | A1 | 3/2009 | |
| WO | 2012/165583 | A1 | 12/2012 | |

OTHER PUBLICATIONS

Taiwanese Office Action dated Jun. 20, 2016 in corresponding Taiwanese Application No. 104100694 (With partial English translation).
International Search Report dated Jan. 20, 2015 in PCT/JP2014/078723 filed Oct. 29, 2014.
Extended European Search Report dated Feb. 20, 2018 in European Patent Application No. 14904944.7, citing documents AA, AO and AP therein, 9 pages.
International Preliminary Report on Patentability and Written Opinion dated May 11, 2017 in PCT/JP2014/078723 (with English language translation).
Combined Office Action and Search Report dated Sep. 12, 2018 in Chinese Patent Application No. 201480083011.9 with unedited computer generated English translation.
Chinese Office Action dated May 5, 2019, in Patent Application No. 201480083011.9, 20 pages (with English translation).
Office Action dated Nov. 1, 2019, in Chinese Patent Application No. 201480083011.9, with English-language Translation.
International Search Report dated Jan. 20, 2015 in International Patent Application No. PCT/JP2014/078724, 2 pages.
Extended European Search Report dated Feb. 28, 2018 in European Patent Application No. 14898292.9, 9 pages.
Office Action dated Apr. 23, 2018 in Korean Patent Application No. 10-2017-7007574, 8 pages.
Office Action dated Jul. 4, 2018 in Chinese Patent Application No. 201480082514.4, 17 pages.

* cited by examiner

ELECTRIC DISCHARGE GENERATOR AND POWER SUPPLY DEVICE OF ELECTRIC DISCHARGE GENERATOR

TECHNICAL FIELD

The present invention relates to an electric discharge generator that includes a power supply device, can generate a radical gas, and can perform a process in which the radical gas is used, and also relates to a power supply device of electric discharge generator. The present invention is applicable to, for example, formation of a high-performance film on a target object.

BACKGROUND ART

In various industries including the semiconductor manufacturing, a need exists for multifunctional, high-quality thin films (e.g., highly insulative thin films, semiconductor thin films, highly dielectric thin films, light-emitting thin films, highly magnetic thin films, and superhard thin films).

For example, in the manufacturing of semiconductor devices, films for use in semiconductor chips include a highly conductive film with a low impedance that corresponds to circuit wiring, a highly magnetic film that functions as a wiring coil of a circuit or as a magnet, a highly dielectric film that functions as a capacitor in a circuit, and a highly insulative film that causes a less amount of electrical leakage current.

Examples of techniques that have been used to form these films include the thermal chemical vapor deposition (CVD) apparatus, the photo CVD apparatus, and the plasma CVD apparatus. Particularly, the plasma CVD apparatus has been commonly used. As compared to the thermal and photo CVD apparatuses or the like, the plasma CVD apparatus can lower the temperature of film formation and increase the speed of film formation, so that a film formation process can be accelerated.

For example, the following technique that uses the plasma CVD apparatus is generally employed to form, on a semiconductor substrate, a gate insulation film such as a nitride film (e.g., SiON or HfSiON) or an oxide film ($SiO_2$ or $Hfo_2$).

Thus, a gas of $NH_3$ (ammonia), $N_2$, $O_2$, $O_3$ (ozone), or the like and a precursor gas of silicon, hafnium, or the like are directly supplied to a process chamber apparatus in which the CVD process is to be performed. In the process chamber apparatus, the precursor gas is dissociated to form metal particles, and then, a thin film such as a nitride film or an oxide film is formed on a target object by a chemical reaction between the metal particles and the above-mentioned gas of $NH_3$ (ammonia) or the like.

In the plasma CVD apparatus, high-frequency plasma or microwave plasma is directly generated in the process chamber apparatus. The target object is accordingly exposed to a radical gas or plasma ions (or electrons) having a high energy.

Patent document 1 is an example of related art documents in which techniques associated with plasma CVD apparatuses are disclosed.

In the film formation process performed in the plasma CVD apparatus, the target object is directly exposed to plasma, as mentioned above. The target object is heavily damaged by plasma (ions or electrons), so that the performance of a semiconductor function suffers.

In contrast, in the film formation process using the thermal and photo CVD apparatuses, the target object is not damaged by plasma (ions or electrons), and a high-quality film such as a nitride film or oxide film is formed accordingly. In such a film formation process, however, it is difficult to provide a large amount of highly concentrated radical gas source and it accordingly takes a very long time to form a film.

The recent thermal and photo CVD apparatuses use, as a source gas, an HN gas or a $O_3$ gas, which is highly concentrated and readily dissociated by radiation of heat or light. In a CVD chamber apparatus, a thermal catalyst is provided. Thus, a catalytic action promotes dissociation of the gas in the thermal and photo CVD apparatus, whereby a film such as a nitride film or an oxide film can be formed in a short time. However, this saves only a limited amount of time, and thus, it is difficult to accelerate the film formation significantly.

An example of apparatuses that can reduce damages to the target object caused by plasma and can further accelerate the film formation is a film formation process apparatus of remote plasma type (see, for example, Patent Document 2).

According to the technique disclosed in Patent Document 2, a plasma generation region and a target object process region are separated by a partition (plasma confining electrode). Specifically, according to the technique disclosed in Patent Document 2, the plasma confining electrode is located between a high-frequency application electrode and a counter electrode on which a target object is placed. The technique disclosed in Patent Document 2 provides the target object with only neutral activated species.

According to the technique disclosed in Patent Document 3, part of a source gas is activated by plasma in a remote plasma source. In the remote plasma source, a gas channel circles around in a loop. An active gas generated in the remote plasma source is discharged and supplied to the apparatus in which a target object is placed.

Various source gases such as a nitrogen gas, an oxygen gas, an ozone gas, or a hydrogen gas may be used in the thin film technique according to Patent Document 3 and the like. An activated radical gas is generated from the source gas, and then, a thin film is formed on a target object through the use of the radical gas.

The radical gas is highly reactive. The radical gas in minute quantities (at a concentration less than or equal to about 1%: 1000 ppm) is sprayed onto a target object to promote a chemical reaction in the target object, whereby a film such as a nitrogen thin film, an oxide thin film, or a hydrogen-bonding thin film can be efficiently formed in a short time.

A radical gas generation apparatus includes discharge cells (generators). In the discharge cells, high-field plasma is created through the use of a dielectric barrier discharge, which is atmospheric pressure plasma. Consequently, a high-quality radical gas is generated from the source gas exposed to the plasma in the discharge cells. The plurality of discharge cells are disposed in the radical gas generation apparatus, so that the generated radical gas is sprayed in many different quarters and the resultant radical gas becomes available for use.

PRIOR ART DOCUMENTS

Patent Documents

Patent Document 1: Japanese Patent Application Laid-Open No. 2007-266489

Patent Document 2: Japanese Patent Application Laid-Open No. 2001-135628

Patent Document 3: Japanese Patent Application Laid-Open No. 2004-111739

SUMMARY OF INVENTION

Problems to be Solved by the Invention

However, the conventional radical gas generation apparatuses fail to generate an effective, highly reactive radical gas. Further, it is difficult to obtain a radical gas in large quantities and the radical gas is supplied from one direction. In addition, the lifetime of the generated radical gas is very short. Thus, it is difficult to minimize a decrease in concentration and to conduct a radical gas from the radical gas generation apparatus to a radical gas process area (a thin film generation area, namely, a process chamber apparatus) that is separate from the radical gas generation apparatus.

The radical gas outlet may be formed into an orifice such that a radical gas sprayed from the radical gas generation apparatus is applied to an object placed in the process chamber apparatus in a short time. This involves reducing the opening diameter of an opening which is a radical gas transmission path from the radical gas generation apparatus to the process chamber apparatus. Thus, reducing the pressure (creating a vacuum) in the process chamber apparatus causes a difference in pressure between the inside of the radical gas generation apparatus and the inside of the process chamber apparatus, so that the radical gas is sprayed into the process chamber apparatus at a high speed. The radical gas can be conducted from the radical gas generation apparatus to the process chamber apparatus while being kept in high concentrations.

According to the above-mentioned method, the opening needs to have a diameter of, for example, about several tens of millimeters. Unfortunately, through the opening of this size, the radical gas is sprayed onto only a limited part of the target object in the process chamber apparatus. This makes it difficult to form a thin film evenly on a large area (e.g., a target object having a diameter of 200 mm or more).

The present invention therefore has an object to provide a radical gas generation system (a film formation process system of remote plasma type, an electric discharge generator, and a power supply device of electric discharge generator) that includes a radical gas generation apparatus and a process chamber apparatus located apart from or adjacent to each other. The electric discharge generator and the power supply device of electric discharge generator are capable of conducting a radical gas from the radical gas generation apparatus to the process chamber apparatus, spraying a radical gas in any desired concentration from may different quarter into the process chamber apparatus, performing a process through the use of the radical gas evenly on, for example, a target object having a large area, and performing, at a high speed, the process in which the radical gas is used.

Means to Solve the Problems

In order to achieve the above-mentioned objective, an electric discharge generator and a power supply device of electric discharge generator according to the present invention includes a radical gas generation apparatus, a process chamber apparatus, and a power supply device that applies an alternating current voltage to the radical gas generation apparatus. The radical gas generation apparatus generates a radical gas from a source gas using a dielectric barrier discharge. The process chamber apparatus is connected to the radical gas generation apparatus, accommodates a target object, and performs, on the target object, a process in which the radical gas is used. The process chamber apparatus includes a table on which the target object is placed. The table causes the target object to rotate. The radical gas generation apparatus includes a plurality of discharge cells and a source gas supply unit. The plurality of discharge cells cause the dielectric barrier discharge. The source gas supply unit supplies the radical gas generation apparatus with the source gas. Each of the plurality of discharge cells includes a first electrode portion, a second electrode portion, and an opening. The first electrode portion includes a first electrode member. The second electrode portion is opposed to the first electrode portion and includes a second electrode member. The opening is connected to the inside of the process chamber and faces the target object placed on the table. The radical gas generated from the source gas using the dielectric barrier discharge is output through the opening. The power supply device includes a power supply circuit configuration that receives input of one alternating current voltage and controls output of n-phase alternating current voltages, applies each of the n-phase alternating current voltages to corresponding one of the plurality of discharge cells, and variably controls, according to positions of the plurality of discharge cells, the alternating current voltages to be applied to the plurality of discharge cells, where n represents the number of the plurality of discharge cells.

Effects of the Invention

The electric discharge generator and the power supply device of electric discharge generator according to the present invention includes the radical gas generation apparatus, the process chamber apparatus, and the power supply device that applies the alternating current voltage to the radical gas generation apparatus. The radical gas generation apparatus generates the radical gas from the source gas using the dielectric barrier discharge. The process chamber apparatus is connected to the radical gas generation apparatus, accommodates the target object, and performs, on the target object, the process in which the radical gas is used. The process chamber apparatus includes the table on which the target object is placed. The table causes the target object to rotate. The radical gas generation apparatus includes the plurality of discharge cells and the source gas supply unit. The plurality of discharge cells cause the dielectric barrier discharge. The source gas supply unit supplies the radical gas generation apparatus with the source gas. Each of the plurality of discharge cells includes the first electrode portion, the second electrode portion, and the opening. The first electrode portion includes the first electrode member. The second electrode portion is opposed to the first electrode portion and includes the second electrode member. The opening is connected to the inside of the process chamber and faces the target object placed on the table. The radical gas generated from the source gas using the dielectric barrier discharge is output through the opening. The power supply device includes the power supply circuit configuration that receives input of one alternating current voltage and controls the output of the n-phase alternating current voltages, applies each of the n-phase alternating current voltages to the corresponding one of the plurality of discharge cells, and variably controls, according to the positions of the plurality of discharge cells, the alternating current voltages to be applied to the plurality of discharge cells, where n represents the number of the plurality of discharge cells.

The radical gas can be conducted from the radical gas generation apparatus to the process chamber apparatus.

Also, the small-footprint apparatus can perform, at a low cost, a radical gas process evenly on a target object having a large area.

Thus, a plurality of radical gases can be conducted from the radical gas generation apparatus to the process chamber apparatus. Furthermore, only one alternating current power supply is required for the plurality of discharge cells to output the radical gas generated at a given flow rate and to conduct the radical gas to the process chamber apparatus. In the radical gas generation system according to the present invention, the small radical gas generation apparatus can perform the radical gas process evenly on a target object having a large area in a relatively short time at a low cost.

DESCRIPTION OF EMBODIMENT

Figure 1:
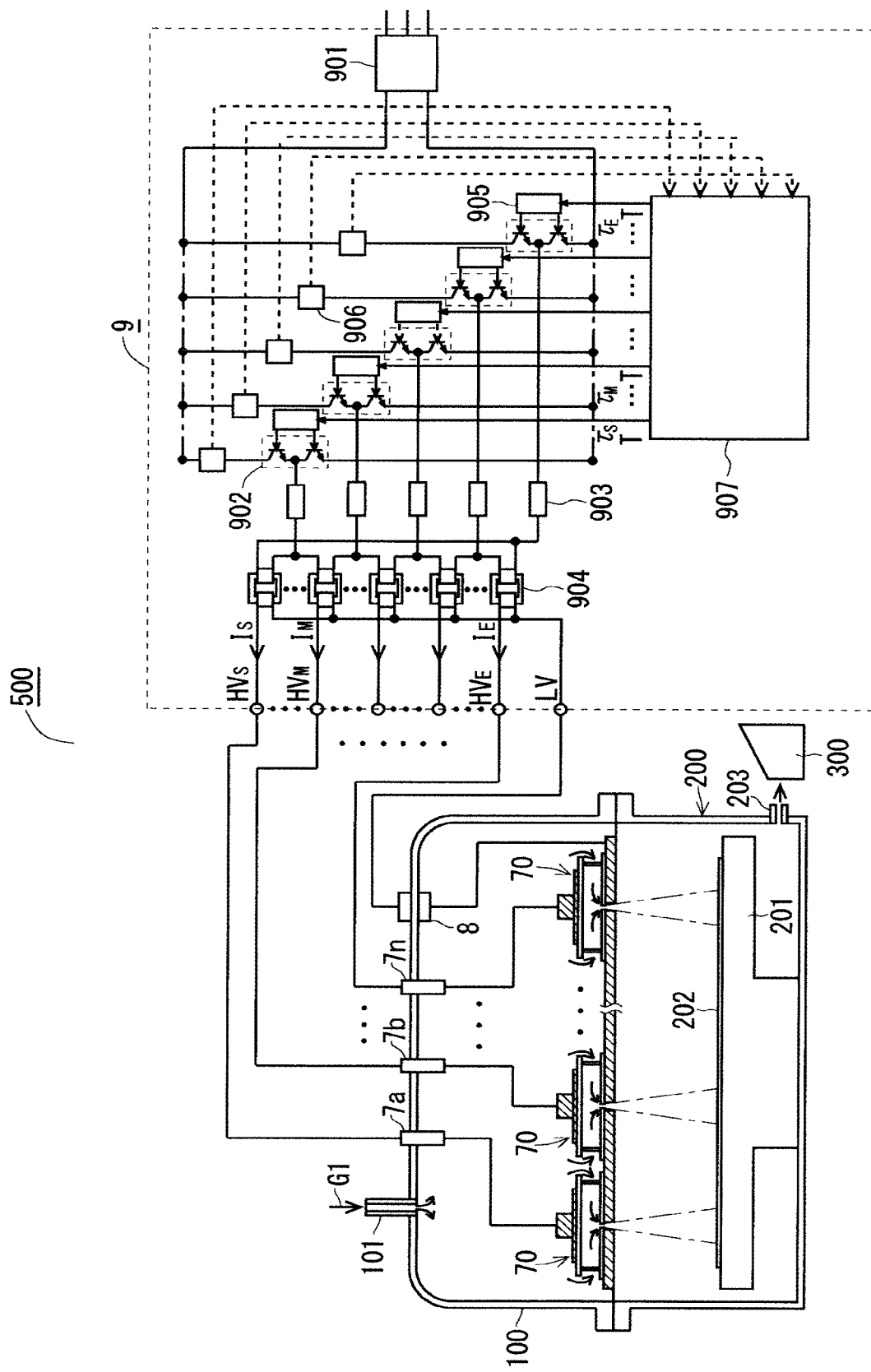
FIG. 1 A diagram illustrating an example configuration of a radical gas generation system 500 according to the present invention.

As mentioned above, the inventors have found the configuration which allows a plurality of radical gases, which are kept in high concentrations, to be conducted from a radical gas generation apparatus to a process chamber apparatus through the use of one alternating current power supply. In this configuration, radical gases are generated in the discharge space between opposing electrodes and each discharge cell sprays a radical gas from an opening having a small diameter.

The radical gas generation apparatus and the process chamber apparatus vertically adjoin each other in such a manner that the radical gas generation apparatus is stacked on top of the process chamber apparatus. The opening is a radical gas transmission path from the radical gas generation apparatus to the process chamber apparatus. A plurality of openings are provided. The individual openings face the main surface of a target object.

In this configuration, however, it is difficult to perform a process in which the radical gas is used (hereinafter also referred to as, for example, a "film formation process") evenly on the target object placed in the process chamber apparatus, as mentioned above. Increasing the number of openings can smooth the unevenness to some extent but fails to eliminate the problem of the unevenness.

As a workaround to the uneven film formation mentioned above, the target object is rotated in the process chamber in a plan view. In this configuration, however, the local rotation speed of the target object increases with increasing distance from the center of rotation in a planar direction (v (speed)=r (radius)×ω(angular velocity)). It is difficult to completely solve the above-mentioned problem of the uneven film formation process by the configuration in which the target object is rotated and the radical gas is sprayed into the process chamber through the individual openings.

The following configuration may be another workaround to the uneven film formation. As mentioned above, the plurality of openings, which are radical gas spraying portions, are provided. In this configuration, discharge cells are provided in one-to-one correspondence with the openings and the individual discharge cells control the amount of generated radical gas (the concentration of radical gas).

Each discharge cell may include an alternating current power supply and control (change) the electric power supplied from the alternating current power supply, so that the amount of radical gas (the concentration of the radical gas) varies among the discharge cells. This method requires a plurality of alternating current power sources. This leads to upsizing of the radical gas generation system as a whole, thus driving up costs.

Alternatively, the opening diameter of each opening (the aperture diameter of each orifice) may be changed such that the amount of radical gas varies among the discharge cells. In the case where the opening diameter of the opening for the radical gas (the aperture diameter of the orifice) varies among the discharge cells, the velocity of flow of radical gas sprayed from the opening also varies among the discharge cells. A film may not be formed evenly owing to variations in the velocity of flow of gas.

The inventors have provided an inverter power supply in which the amount of radical gas varies among the discharges cells. In one power supply, which will be described below, inverter elements are configured to output alternating current voltages of n phases, which are independent of one another. The frequencies of the output n-phase alternating current voltages are fixed. For each phase, only an amplitude value E can be set at any desired value. The power supply is referred to as an n-phase inverter power supply device. The present invention will be specifically described below with reference to drawings illustrating an embodiment thereof.

Embodiment

Figure 2:
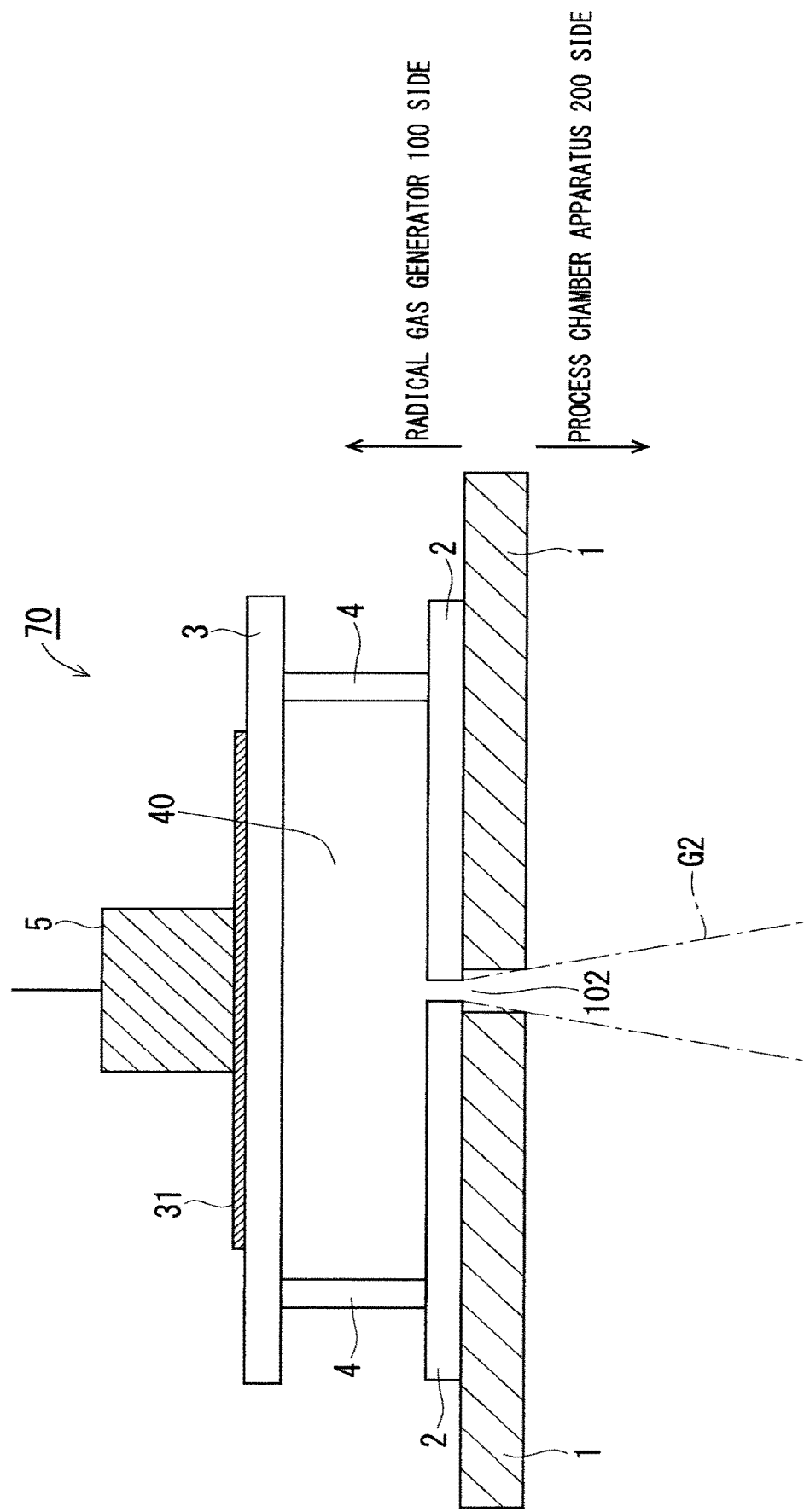
FIG. 2 An enlarged cross-sectional view of an example configuration of a discharge cell 70 according to the present invention.
Figure 3:
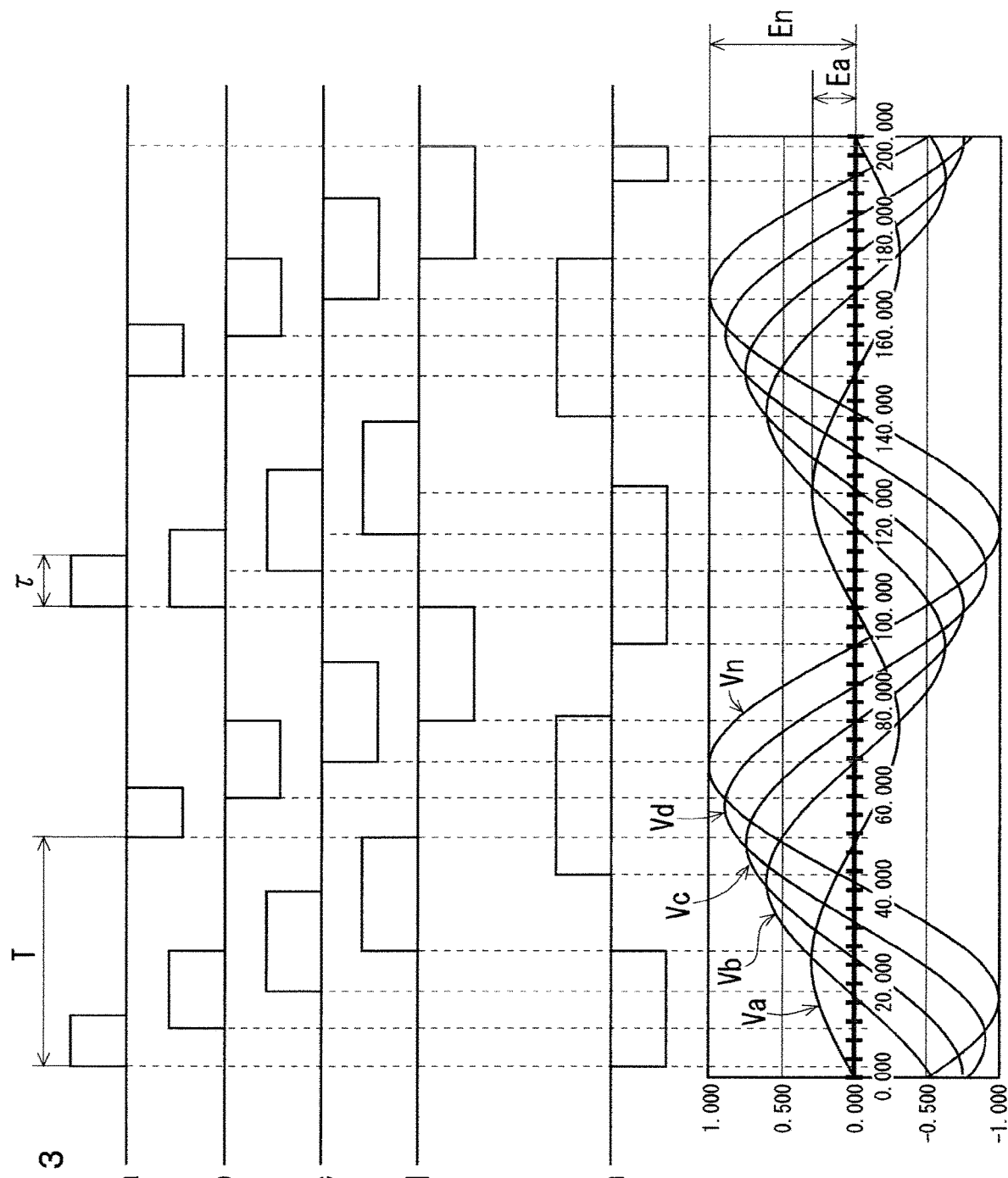
FIG. 3 A diagram illustrating drive pulse cycles for use in the driving of inverter elements 902, pulse-width signal waveforms, and waveforms of alternating current voltages output to the discharge cells 70.

FIG. 1 illustrates an example configuration of a radical gas generation system 500 including a power supply device (an electric discharge generator and a power supply device of electric discharge generator) according to an embodiment. FIG. 2 is an enlarged cross-sectional view of a configuration of a discharge cell 70 according to the present invention. FIG. 3 illustrates one embodiment by showing drive pulse cycles, pulse-width signal waveforms, and waveforms of alternating current voltages output to the discharge cells 70. The pulse cycles are for use in the driving of inverter elements 902 included in the n-phase inverter power supply device 9, which offers a means to output "n" output alternating current voltages.

The radical gas generation system 500 according to the embodiment will be described below with reference to FIGS. 1, 2, and 3.

As illustrated in FIG. 1, the radical gas generation system 500 includes a radical gas generation apparatus 100, a process chamber apparatus 200, and one n-phase inverter power supply device 9 that can output the n-phase alternating current voltages, and a vacuum pump 300.

Here, "n" used to refer the n phase is equivalent to "n" representing the number of discharge cells 70 disposed in the radical gas generation apparatus 100.

The radical gas generation system 500 is a film formation process system of remote plasma type in which the radical gas generation apparatus 100 that generates a radical gas G2 is located separately from the process chamber apparatus 200 that performs, for example, a film formation process in which the generated radical gas G2 is used.

As illustrated in FIG. 1, the bottom surface side of the radical gas generation apparatus 100 is in contact with the upper surface side of the process chamber apparatus 200. As will be described below, the inside of the radical gas generation apparatus 100 is connected to the inside of the process chamber apparatus 200 through an opening 102. As mentioned above, a plurality of openings 102 are provided.

In the radical gas generation apparatus 100, the radical gas G2 is generated from a source gas G1 using the dielectric barrier discharge. The radical gas G2 is generated from part of the source gas G1 formed into a radical gas due to the dielectric barrier discharge.

As illustrated in FIG. 1, the radical gas generation apparatus 100 includes a plurality of discharge cells 70. Specifically, the discharge cells 70 are located on the bottom surface of the radical gas generation apparatus 100.

As illustrated in FIG. 2, each of the discharge cells 70 includes first electrode portions 1 and 2 and second electrode portions 5, 31, and 3. The first electrode portions 1 and 2 are opposed to the second electrode portion 5, 31, and 3 with a predetermined gap therebetween.

Between the first electrode portions 1 and 2 and the second electrode portions 5, 31, and 3, a discharge space 40 is formed in which a dielectric barrier discharge occurs. At least one spacer 4 is located between the first electrode portions 1 and 2 and the second electrode portions 5, 31, and 3 such that the gap length (the distance between the first electrode portions 1 and 2 and the second electrode portions 5, 31, and 3 in FIG. 2) is kept equal across the discharge space 40.

As illustrated in FIG. 2, the first electrode portions 1 and 2 include a low voltage electrode (which can be regarded as a first electrode member) 1 and a first dielectric (film) 2.

The low voltage electrode 1 is at the ground potential and is located on the bottom surface of the radical gas generation apparatus 100. All of the discharge cells 70 share one low voltage electrode 1. The first dielectric 2 is formed on the low voltage electrode 1.

The second electrode portions 5, 31, and 3 include a high voltage electrode block 5, a high voltage electrode (which can be regarded as a second electrode member) 31, and a second dielectric (film) 3, respectively.

The high voltage electrode 31 is formed on the second dielectric 3. The high voltage electrode block 5 is located on the high voltage electrode 31 so as to be connected thereto. The high voltage electrode block 5 is supplied with a high alternating current voltage. The high voltage electrode block 5 is electrically connected to the high voltage electrode 31, so that the high voltage is also applied to the high voltage electrode 31.

As illustrated in FIG. 1, the openings 102 that functions as orifices are provided in the individual discharge cells 70.

Each of the openings 102 is formed so as to penetrate the first dielectric 2 and the low voltage electrode 1. The opening 102 is formed in the middle of the first dielectric 2. Through the opening 102, the inside of the radical gas generation apparatus 100 (specifically, the discharge space 40) is connected with the inside of the process chamber apparatus 200. Thus, the radical gas G2 generated in the discharge space 40 is output to the inside of the process chamber apparatus 200 through the opening 102. The opening 102 faces the treatment surface of a target object 202 placed in the process chamber apparatus 200.

In one embodiment, the individual discharge cell 70 has a disc-shaped outline or a coaxial conical outline in a plan view. This means that the first dielectric 2 and the second dielectric 3 both have disc shapes or conical shapes and are located in parallel with each other or are located coaxially so as to be opposed to each other (the high voltage electrode 31 also has a disc shape or a conical shape). When the discharge cell 70 is viewed from the above, the periphery of the first dielectric 2 coincides with the periphery of the second dielectric 3. The individual discharge cell 70 does not necessarily have a disc-shaped outline or a conical outline in a plan view and may have any shape as long as the same effects are produced.

The outlines of the discharge cells 70 are of the same shape. For example, in the case where the individual discharge cell 70 has a disc shaped outline as mentioned above, the size of the outline of the discharge cell 70 in a plan view is determined by the diameter of the first dielectric 2 (and the diameter of the second dielectric 3).

The n-phase inverter power supply device 9 includes a rectifier circuit 901, "n" inverter elements 902, "n" current-limiting reactors 903, "n" transformers 904, current detectors 906 that detect current flowing through the inverter elements 902, a gate circuit 905 that drives ON-OFF command signals from the individual inverter elements 902, and a control circuit 907 that controls the n-phase inverter power supply device 9.

With reference to FIG. 1, a commercial three-phase alternating current voltage is input to the rectifier circuit 901 of the n-phase inverter power supply device 9 (the three-phase alternating current voltage according to the illustration may be replaced with a single-phase alternating current voltage). The output voltage from the rectifier circuit 901 is rectified and converted into a direct current voltage. The direct current voltage is applied to a plurality of ("n") inverter elements 902 arranged in parallel with each other.

The individual inverter element 902 includes two switching elements such as power transistors placed in series. The gate of the individual switching element receives, from the gate circuit 905, input of a signal alternating between ON and OFF. The signal is received, and then, the individual current-limiting reactor 903 receives input of an alternating current pulse voltage generated due to the switching between ON and OFF of the direct current voltage. The alternating current pulse voltage is input to the primary side of the individual transformer 904 via the individual current-limiting reactor 903.

On the primary side of "n" transformers 904, "n" transformers are coupled through delta connection. A primary voltage input to the individual transformer causes a secondary-side voltage of the individual transformer 904 to rise, and then, the resultant high voltage is output. On the secondary side of the transformers 904, Y-connection is formed, with one end of one of "n" transformers 904 and one end of another one of "n" transformers 904 being integral with each other and being at the same low voltage (LV). Alternating current high voltages (HV) of different phases are output to secondary-side terminals, each of which being another end of the individual transformer 904. The alternating current high voltages (HV) of different phases are applied to the discharge cells 70.

With reference to FIG. 1, the n-phase inverter power supply device 9 can output, to the radical gas generation apparatus 100 (specifically, to the discharge cells 70), a plurality of alternating current high voltages for discharging. When the plurality of alternating current high voltages are applied to the discharge cells 70, a dielectric barrier discharge occurs in the discharge space 40 of the individual discharge cell 70. Then, the radical gas G2 is generated in the discharge space 40 due to the interaction between the source gas G1 passing through the discharge space 40 and the dielectric barrier discharge. That is to say, the radical gas G2, which is part of the source gas G1 formed into a radical gas due to the dielectric barrier discharge, is generated in the radical gas generation apparatus 100 using the dielectric barrier discharge.

Provided on the upper surface portion of the radical gas generation apparatus 100 is a source gas supply unit 101. The source gas supply unit 101 supplies the radical gas generation apparatus 100 with the source gas G1, from which the radical gas G2 is to be derived. The source gas G1 supplied from the source gas supply unit 101 fills the radical gas generation apparatus 100. The fixed amount of the source gas G1 enters the discharge cells 70 from the outside thereof and flows through the discharge spaces 40.

The radical gas G2 generated in the radical gas generation apparatus 100 is sprayed into the process chamber apparatus 200. The process chamber apparatus 200 performs a process, such as thin film formation, on the main surface of the target object 202 using the radical gas.

Suppose that the radical gas generation apparatus 100 is supplied with the source gas G1 which is a nitrogen gas. In this case, a nitrogen radical gas is generated, as the radical gas G2, from the nitrogen gas in the discharge cells 70 of the radical gas generation apparatus 100. The process chamber apparatus 200 accordingly forms a nitride film on the target object 202 using the nitrogen radical gas G2 sprayed from the radical gas generation apparatus 100.

Suppose that the radical gas generation apparatus 100 is supplied with the source gas G1 which is an ozone gas or an oxygen gas. In this case, an oxygen radical gas is generated, as the radical gas G2, from the ozone gas or the oxide gas in the discharge cells 70 of the radical gas generation apparatus 100. The process chamber apparatus 200 accordingly forms an oxide film on the target object 202 using the radical gas G2 sprayed from the radical gas generation apparatus 100.

Suppose that the radical gas generation apparatus 100 is supplied with the source gas G1 which is a hydrogen gas or water vapor. In this case, a hydrogen radical gas is generated, as the radical gas G2, from the hydrogen gas in the discharge cells 70 of the radical gas generation apparatus 100, or an OH radical gas (a hydroxyl radical gas) is generated, as the radical gas G2, from the water vapor in the discharge cells 70 of the radical gas generation apparatus 100. The process chamber apparatus 200 accordingly forms a hydrogen-reduced film (a metal film with enhanced hydrogen bonding) on the target object 202 using the hydrogen radical gas G2 or the OH radical gas G2 sprayed from the radical gas generation apparatus 100.

Provided on the lower side surface of the process chamber apparatus 200 is a gas outlet 203 that is to be connected to the vacuum pump 300. The gas is discharged through the vacuum pump 300, so that the pressure in the process chamber apparatus 200 is maintained at about several torrs to several tens of torrs (several kPa). The vacuum pump 300 produces a flow of gas from the radical gas generation apparatus 100 to the process chamber apparatus 200. The openings 102 function as orifices so that a pressure division is provided between the radical gas generation apparatus 100 and the process chamber apparatus 200.

As illustrated in FIG. 1, a table 201 is located in the process chamber apparatus 200. The target object 202 is placed on the table 201. The target object 202 is exposed to the radical gas G2 sprayed from the openings 102 of the radical gas generation apparatus 100. Then, the target object 202 undergoes a process (e.g., formation of a thin film) in which the radical gas G2 is used. The table 201 rotates clockwise or counterclockwise in a plan view in a state in which the target object 202 is placed thereon. The target object 202 accordingly rotates along with the table 201.

As mentioned above, the outlines of the discharge cells 70 are of the same shape. The openings 102 formed in the discharge cells 70 have the same opening diameter. Thus, the pressure drop caused by a flow of gas becomes equal among the discharge cells 70 and the openings 102. The gas flows equally through the discharge cells 70, so that the radical gas G2 is sprayed into the process chamber apparatus 200 at approximately the same speed.

As illustrated in FIG. 1, an LV output terminal of the n-phase inverter power supply device 9 is connected to the low voltage electrode 1 through a terminal 8. As mentioned above, the low voltage electrode 1 is shared by the discharge cells 70 and is at the ground potential. HV output terminals of the n-phase inverter power supply device 9 are connected to the high voltage electrode blocks 5 of the discharge cells 70 through terminals 7a, 7b, . . . , and 7n. The n-phase inverter power supply device 9 can apply the n-phase alternating current high voltages to the discharge cells 70 through the above-mentioned interconnection.

As mentioned above, one n-phase inverter power supply device 9 applies, to the discharge cells 70, the plurality of alternating current high voltages (HV) of different phases. The low voltage electrode 1 and the high voltage electrode block 5 each include a structure that can provide cooling using coolant or the like to dissipate the generated heat. Such a structure for providing cooling is omitted for the sake of simplifying the drawing.

In each discharge cell 70, the discharge space 40 is the region in which the high voltage electrode 31 and the low voltage electrode 1 face each other. The LV output terminal of the n-phase inverter power supply device 9 is connected to the low voltage electrode 1, whereas the HV output terminals of the n-phase inverter power supply device 9 are connected to the high voltage electrodes 31 through the terminals 7a, 7b, . . . , and 7n, and the high voltage electrode blocks 5. When an alternating current high voltage is applied between the low voltage electrode 1 and the individual high voltage electrode 31, the dielectric barrier discharge occurs in the individual discharge space 40. As mentioned above, the radical gas G2, which is part of the source gas G1 formed into a radical gas due to the dielectric barrier discharge, is generated in the individual discharge space 40 through the use of the source gas G1 and the dielectric barrier discharge as mentioned above.

Through the openings 102, the generated radical gas G2 is sprayed on the target object 202 placed in the process chamber apparatus 200 as mentioned above. The concentration of the radical gas G2 sprayed into the process chamber apparatus 200 is normally less than 1% (10000 ppm) and most of the remaining gas is the source gas G1. The source gas G1 serves as a carrier gas that carries the generated radical gas G2 from the discharge cells 70 to the inside of the process chamber apparatus 200 in a short time.

Thus, the speed of the radical gas G2 sprayed from the openings 102 of the discharge cells 70 is dependent on the source gas G1. When the spray speed is low, it takes much time for the radical gas G2 to reach the target object 202 and part of the generated radical gas G2 probably disappears. Consequently, the target object 202 is exposed to the radical gas G2 in small concentrations (gas concentrations). This translates into a reduction in the efficiency of the process performed on the target object 202 through the use of the radical gas G2.

Thus, the speed of the radical gas G2 sprayed from the openings 102 of the discharge cells 70 needs to be kept at a certain level or higher. It is desirable that each of the openings 102 be shaped in an orifice with a small opening diameter.

In the case where each of the openings 102 has a small opening diameter, the radical gas G2 is sprayed at a higher speed, and thus, the radical gas G2 is less likely to disappear. However, the area of the target object 202 exposed to the radical gas G2 is confined within narrow limits. Although each of the discharge cells 70 has the opening 102 formed therein, it is difficult to apply the radical gas G2 evenly to the target object 202 in the state in which the area exposed to the radical gas G2 is limited within narrow limits.

It is desirable that the spray speed of the radical gas G2 be kept equal among the discharge cells 70. The discharge cells 70 have the same outline shape and the openings 102 have the same opening diameter such that the spray speed of the radical gas G2 becomes equal among the discharge cells 70.

It is undesirable that the spray speed of the radical gas G2 vary among the discharge cells 70. Meanwhile, each of the openings 102 needs to have a small opening diameter such that the radical gas G2 can be sprayed at a high speed. However, reducing the opening diameter makes it difficult to perform the radical gas process evenly over a wide area.

The present invention therefore has the following configuration such that the spray speed of the radical gas G2 is kept high and equal among the discharge cells 70 and that the radical gas process is performed evenly over a wide area of the target object 202.

When being exposed to the radical gas G2, the target object 202 is rotated along with the table 201 at a certain speed. The radical gas generation apparatus 100 includes the plurality of discharge cells 70. Each of the discharge cells 70 has the opening 102. The position of the individual opening 102 is fixed.

The target object 202 is rotated while the radical gas G2 is sprayed from the openings 102, so that the radical gas process can be performed more extensively on the target object 202. However, the circumferential speed varies from position to position, according to the distance from the rotation center of the target object 202. In the state where the radical gas G2 is sprayed from the discharge cells 70 at the same rate and the circumferential speed varies from position to position, the performance of the radical gas process on the target object 202 varies according to the distance from the rotation center of the target object 202.

Thus, the flow rate of the radical gas G2 sprayed from the discharge cells 70 needs to be changed and adjusted with respect to the rotation center of the target object 202. In other words, the flow rate component of the radical gas G2, which has been formed into a radical and is to be sprayed from the discharge cells 70, needs to be controlled in accordance with the circumferential speed associated with the rotation of the target object 202 (the table 201) such that the radical gas process is performed evenly on the target object 202.

In the present invention, the flow rate of the radical gas G2 is controlled in such a manner that, of the discharge cells 70, a discharge cell 70 located farther from the center position of the rotation of the target object 202 in a plan view is subjected to application of a higher alternating current voltage waveform, which is applied between the high voltage electrode 31 and the low voltage electrode 1. This voltage application increases the load current to be supplied to the discharge space 40, with increased supply of electric discharge energy to the discharge cells 70 and increased production of the radical gas G2. The flow rate component of the radical gas G2 formed into a radical can be changed according to the position of the individual discharge cell 70.

The circumferential speed is higher at a position farther from the rotation center of the target object 202, and thus, such a position is exposed to the radical gas G2 for a shorter period of time. Conversely, the circumferential speed is lower at a position closer to the rotation center of the target object 202, and thus, such a position is exposed to the radical gas G2 for a longer period of time. Here, the rotation speed (angular speed) of the target object 202 is constant. The value of the alternating current voltage to be applied to the individual discharge cell 70 is changed in such a manner that the amount of the radical gas (the concentration of the radical gas) generated in the discharge cell 70 is inversely proportional to the exposure time determined based on the position of the discharge cell 70.

Take, for example, two discharge cells 70. One discharge cell 70 is located at a first distance from the rotation center of the target object 202 in a plan view. The other discharge cell 70 is located at a second distance from the rotation center of the target object 202 in a plan view. The first distance is shorter than the second distance.

In this case, the n-phase inverter power supply device 9 applies the alternating current voltage in such a manner that the value of the alternating current voltage applied between the high voltage electrode 31 and the low voltage electrode 1 of the other discharge cell 70 is higher than the value of the alternating current voltage applied between the high voltage electrode 31 and the low voltage electrode 1 of the one discharge cell 70. Thus, the amount of the electric discharge energy applied to the other discharge cell 70 becomes greater than the amount of the electric discharge energy applied to the one discharge cell 70, and the amount (concentration) of the radical gas generated due to discharge becomes greater in the other discharge cell 70 than in the one discharge cell 70, accordingly. Thus, the flow rate component of the radical gas G2 sprayed from the opening 102 of the other discharge cell 70 becomes greater than the flow rate component of the radical gas G2 sprayed from the opening 102 of the one discharge cell 70.

As mentioned above, the n-phase inverter power supply device 9 applies alternating current voltages of different values to the discharge cells 70 according to the distance between the individual discharge cell 70 and the above-mentioned rotation center such that the concentration of the radical gas G2 generated in the discharge space 40 varies according to the distance between the individual discharge cell 70 and the above-mentioned rotation center. With reference to FIGS. 1 and 3, the following will describe the configuration and the operation of the n-phase inverter power supply device 9 that can apply voltage in the above-mentioned manner.

In the n-phase inverter power supply device 9 illustrated in FIG. 1, the commercial alternating current power supply (e.g., a three-phase voltage of 200V at a frequency of 60 Hz) on the input side is converted into a direct current by the rectifier circuit 901, and then, is input to each of "n" inverter elements 902 connected in parallel with each other. The inverter elements 902 receive ON-OFF drive signals from the gate circuits 905, so that each of "n" inverter elements 902 can output a given pulse voltage. The output pulse voltage is input to the individual transformer 904 through the individual current-limiting reactor 903. The individual transformer 904 boosts the alternating current voltage corresponding to the pulse voltage input from the individual inverter element 902. The boosted alternating current high voltage is applied to the individual discharge cell 70.

When the ON-OFF drive signals a, b, c, d, . . . , and n illustrated in FIG. 3 are input from the gate circuits 905 to the inverter elements 902, output units of the transformers 904 can output alternating current voltages of different amplitudes (see the waveforms of the n-phase alternating current voltages shown in the lowermost part of FIG. 3).

In the control circuit 907 of the power supply, a pulse cycle T in which each signal turns on and off is kept almost constant (an output frequency f (=1/T) of the inverter is fixed). The ON cycle (phase) of each pulse is moved by the phase (=2·π/n) obtained by dividing a phase angle of 2π by n. The above-mentioned ON-OFF drive signals are represented by pulse signals a, b, c, d, . . . , and n illustrated in FIG. 3.

A pulse width τ of each of the pulse signals a, b, c, d, . . . , and n illustrated in FIG. 3 may be increased in accordance with changes in phase, so that the n-phase alternating current voltages vary in amplitude.

The current detectors 906 detect a current value and the like for each of the alternating current voltages such that the individual discharge cell 70 can output a predetermined amount of electric discharge energy, regardless of changes in load conditions associated with, for example, the ambient temperature in the individual discharge cell 70, the flow rate of the supplied source gas, the gas pressure in the individual discharge cell 70, and the pressure in the process chamber. The current detectors 906 gives detection result feedback to the control circuit 907. In the control circuit 907, the proportional-integral-derivative (PID) control is performed on the set pulse width τ or the set pulse cycle T based on the detection results. This can further stabilize the amount of electric power supplied to each phase.

In the control circuit 907, the PID control is performed on the pulse width τ according to the amount by which the feedback current value differs from the target current value in each phase. The amount of electric power supplied can be accurately controlled per phase through the PID control.

The pulse voltage divided into n phases in the inverter elements 902 is supplied to the primary side of the individual transformer 904 through the individual current-limiting reactor 903. For example, the delta connection or the Y connection is formed on the primary side of the individual transformer 904 to magnetically couple the primary side to the secondary winding. The voltage input to the primary side is boosted according to the turns ratio between the primary winding and the secondary winding. The Y connection is desirably formed on the secondary side of the individual transformer in order to output, from the secondary side, the common low voltage LV and the high voltages HV of different phases independent of one another.

With reference to FIG. 2, the spray speed of the radical gas G2 is determined based mainly on the outside shapes of the dielectrics 2 and 3. As mentioned above, it is desirable that the outlines of the discharge cells 70 be of the same shape as illustrated in FIG. 2 such that the radical gas G2 is sprayed at the same speed. As long as the outside shapes of the dielectrics 2 and 3 are equal among the discharge cells 70, the radical gas G2 can be sprayed from the discharge cells 70 at the same speed, regardless of the differences in the outside shape of the high voltage electrode 31.

As mentioned above, in the radical gas generation system 500 according to the present embodiment, the radical gas generation apparatus 100 includes the plurality of discharge cells 70 and each of the discharge cells 70 has the opening 102. The plurality of radical gases G2 are conducted from the radical gas generation apparatus 100 to the process chamber apparatus 200 through the openings 102. The target object 202 is rotated. One n-phase inverter power supply device 9 outputs, to the discharge cells 70, n-phase alternating current high voltages of different phases independent of one another, so that the amplitude of the alternating current voltage applied to the individual discharge cell 70 varies according to the distance from the rotation center of the target object 202 and the density of the electric discharge energy supplied to the discharge space 40 varies accordingly.

The density of electric discharge energy varies as mentioned above, so that the amount of radical in the radical gas G2 (the concentration of the radical gas) generated in the radical gas generation apparatus 100 varies accordingly through the openings 102. This configuration eliminates the need for providing a plurality of alternating current high voltage sources to one radical gas generation apparatus 100 and uses one n-phase inverter power supply device 9 to control the amount (concentration) of the radical gas G2 sprayed from each of the discharge cells 70. The small-footprint apparatus can perform, at a low cost, a radical gas process evenly on the target object 202 having a large area.

With reference to FIG. 2, the discharge cells 70 have the same outline shape (specifically, the dielectrics 2 and 3 of the discharge cells 70 have the same outside shape) and the openings 102 of the discharge cells 70 have the same opening diameter. The amount (concentration) of the radical generated in the discharge space 40 is variably controlled to be less than 1% at most. The amount (concentration) of the radical can be controlled according to the position of the individual discharge cell 70 while the gas is sprayed through the openings 102 at approximately the same speed.

In the control circuit 907, the PID control is performed based on the feedback on the current value detected in each phase, regardless of small changes in discharge load conditions associated with, for example, the temperature of the individual discharge cell 70, the gas flow rate, and the gas pressure. Thus, the alternating current voltage can be applied more stably and the amount of electric power supplied to the discharge cells 70 can be controlled.

The target object 202 is rotated. Thus, the opening diameter of the individual opening 102 through which the radical gas G2 is sprayed can be reduced and the speed of the radical gas G2 can be further increased accordingly. The radical gas G2 can reach the target object 202 in a short time, so that the radical gas G2 is less likely to disappear before reaching the target object 202.

The dielectrics 2 and 3 that are located in the individual discharge cell 70 so as to face the discharge space 40 may be made of single-crystal sapphire or quartz.

In the discharge space 40, a dielectric barrier discharge occurs, inflicting discharge damage to the dielectrics 2 and 3. The dielectrics 2 and 3 made of single-crystal sapphire or quartz have improved resistance properties, which can minimize the amount of particles that are deposited on the dielectrics 2 and 3 due to the dielectric barrier discharge.

In the radical gas generation apparatus 100, the discharge space 40 needs to be placed in a high-field plasma state such that the high-quality radical gas G2 is generated through the use of the dielectric barrier discharge occurring in the discharge space 40. The electric filed in the discharge space 40 is dependent on the value obtained by multiplying the gas pressure in the discharge space 40 by the gap length in the discharge space. It is required that the value obtained by "P·d(kPa·cm)" be less than or equal to a predetermined value in order to create the high-field plasma state. P denotes the pressure in the radical gas generation apparatus 100 and d denotes the gap length of the individual discharge cell 70

(the distance between the first dielectric 2 and the second dielectric 3, which is equal among the discharge cells 70).

Assume that the same value is obtained as the product of P and d in the following two cases associated with the radical gas, one case (referred to as the former case) fulfilling the condition of "atmospheric pressure+short gap length" and the other case (referred to as the latter case) fulfilling the condition of "reduced pressure+long gap length".

The latter case has the advantages over the former case. That is, the latter case has the advantages that the speed of the gas flowing through the discharge space 40 is increased and that the gap length (the wall of a discharge surface) is extended to minimize the loss of the radical gas G2 caused by a collision of the radical gas G2 with the wall (or to minimize the reduction in the amount of the generated radical gas (the concentration of the generated radical gas)).

The inventors have found that it is desirable that the radical gas generation apparatus 100 fulfill the following conditions in order to drive the dielectric barrier discharge stably and to generate an excellent radical gas.

The inner gas pressure P of the radical gas generation apparatus 100 is desirably set at about 10 to 30 kPa and the gap length d of the discharge space 40 is desirably set at about 0.3 to 3 mm such that the product of P and d is of the order of 0.3 to 9 (kPa·cm).

According to the above-mentioned configuration, the radical gas generation apparatus 100 is disposed in the process chamber apparatus 200 in which the target object 202 is rotated. The radical gas generation apparatus 100 includes the plurality of discharge cells 70. The generation amount of the radical gas to be sprayed through the opening 102 of the individual discharge cell 70 varies according to the position corresponding to the rotation angular speed of the target object 202, so that a film is deposited evenly on the target object having a large area in a short time. The above-mentioned configuration is applicable to the radical gas generation system including a power supply device. The radical gas generation apparatus 100 includes the plurality of discharge cells 70 and is disposed on the process chamber apparatus 200. The power supply device can apply a given alternating current voltage to each of the plurality of discharge cells 70.

The radical gas generation system that includes the power supply device and is for use in film formation has been described as one embodiment. The above-mentioned configuration is also applicable to other radical gas generators and power supply devices of electric discharge generators.

The invention claimed is:

1. An electric discharge generator and a power supply device of electric discharge generator comprising:
   a radical gas generation apparatus that generates a radical gas from a source gas using a dielectric barrier discharge;
   a process chamber apparatus that is connected to said radical gas generation apparatus, accommodates a target object, and performs, on said target object, a process in which said radical gas is used; and
   a power supply device that applies an alternating current voltage to said radical gas generation apparatus, wherein
   said process chamber apparatus includes a table on which said target object is placed, said table causing said target object to rotate,
   said radical gas generation apparatus includes:
      a plurality of discharge cells that cause said dielectric barrier discharge; and
      a source gas supply unit that supplies said radical gas generation apparatus with said source gas,
   each of said plurality of discharge cells includes:
      a first electrode portion including a first electrode member common to all of the plurality of discharge cells;
      a second electrode portion that is opposed to said first electrode portion and includes a second electrode member formed only in its respective discharge cell; and
      an opening formed in the first electrode portion and connected to the inside of said process chamber and facing said target object placed on said table, said radical gas generated from said source gas using said dielectric barrier discharge being output through said opening, and
   said plurality of discharge cells include first discharge cell that is located at a first distance from a rotation center of said target object in a plan view and second discharge cell that is located at a second distance from said rotation center of said target object in a plan view, said first distance is shorter than said second distance,
   said power supply device includes a power supply circuit configuration that receives input of one alternating current voltage and controls output of n-phase alternating current voltages, applies each of said n-phase alternating current voltages to corresponding one of said plurality of discharge cells, and variably controls, according to distances of said plurality of discharge cells from said rotation center of said target object in a plan view, amplitudes of said alternating current voltages to be applied to said plurality of discharge cells, where n represents the number of said plurality of discharge cells.

2. The electric discharge generator and the power supply device of electric discharge generator according to claim 1, wherein
   said power supply circuit configuration includes n-phase inverters and n-phase transformers,
   each of said n-phase alternating current voltages is applied to corresponding one of said plurality of discharge cells, and
   of said plurality of discharge cells, a discharge cell located farther from said rotation center of said target object in a plan view is subjected to application of a higher value of alternating current voltage,
   said second discharge cell is applied a higher value of alternating current voltage than said first discharge cell.

3. The electric discharge generator and the power supply device of electric discharge generator according to claim 2,
   wherein said power supply device detects a direct current divided into different phases and performs a PID control on a pulse width or a pulse cycle of each of said n-phase inverters based on detection results.

4. The electric discharge generator and the power supply device of electric discharge generator according to claim 1, wherein
   each of said plurality of discharge cells further includes a dielectric that faces a discharge space in which said dielectric barrier discharge occurs, and
   said dielectric is made of single sapphire or quartz.

5. The electric discharge generator and the power supply device of electric discharge generator according to claim 1, wherein
   said radical gas generation apparatus has an internal gas pressure of 10 to 30 kPa, and the distance between said first electrode portion and said second electrode portion is set at 0.3 to 3 mm.

6. The electric discharge generator and the power supply device of electric discharge generator according to claim 1, wherein said source gas comprises a nitrogen gas, said radical gas generation apparatus generates, as said radical gas, a nitrogen radical gas from said nitrogen gas, and said process chamber apparatus forms a nitride film on said target object using said nitrogen radical gas.

7. The electric discharge generator and the power supply device of electric discharge generator according to claim 1, wherein said source gas comprises an ozone gas or an oxygen gas, said radical gas generation apparatus generates, as said radical gas, an oxygen radical gas from said ozone gas or said oxygen gas, and said process chamber apparatus forms an oxide film on said target object using said oxygen radical gas.

8. The electric discharge generator and the power supply device of electric discharge generator according to claim 1, wherein said source gas comprises a hydrogen gas or water vapor, said radical gas generation apparatus generates, as said radical gas, a hydrogen radical gas or hydroxyl (OH) radical gas from said hydrogen gas or said water vapor, and said process chamber apparatus forms a metal film with enhanced hydrogen bonding on said target object using said hydrogen radical gas or said OH radical gas.

\* \* \* \* \*